United States Patent [19]

Crouse et al.

[11] 4,268,756

[45] May 19, 1981

[54] OPTICAL TRANSCEIVER

[75] Inventors: Ronald J. Crouse, Mckinney; Edward C. Wade, Carrollton, both of Tex.

[73] Assignee: TRW Inc., Los Angeles, Calif.

[21] Appl. No.: 959,787

[22] Filed: Nov. 13, 1978

[51] Int. Cl.³ ............................................. G02B 27/00
[52] U.S. Cl. ...................................... 250/551; 250/239
[58] Field of Search ....................... 250/551, 239, 227; 357/19

[56] References Cited

U.S. PATENT DOCUMENTS 3,979,587  9/1976  de Cremoux ..................... 357/19 X

OTHER PUBLICATIONS

Crow, "IBM Technical Disclosure Bulletin, " Oct. 1977, p. 2089.

*Primary Examiner*—David C. Nelms
*Assistant Examiner*—Darwin R. Hostetter
*Attorney, Agent, or Firm*—Kanz & Timmons

[57] ABSTRACT

An optical transceiver for transmitting optical data to an optics communication channel and receiving optical data from the optics communication channel is disclosed. The transceiver includes a light sensor, a light emitter, and an interface between the optical transceiver and the optics communication channel. The light sensor is substantially optically isolated from the light emitter. Electrical data is transmitted responsive to the light sensor, and sufficient electric current is supplied to the light emitter responsive to received electrical data. In one arrangement for an optics cable optics communication channel, the transceiver is interfaced to the optics cable with a beam lead package substantially enclosing the light sensing device and the light emitting device, an eyelet for affixing to one end of the optics cable, a housing with a channel for receivably engaging the eyelet and a slot substantially transverse to the channel receivably engaging in snap-in relationship the beam lead package to align the light sensor and the light emitter with the optics cable through a substantially transparent window in the beam lead packages, and a snap-on retainer engaging the housing for retaining the eyelet within the housing. The portion of the eyelet proximal to the light sensor and the light emitter is covered by a mirror-like surface so shaped that light transmitted through the optics cable and reflected off the light emitter to the mirror-like surface is substantially reflected to the light sensor.

15 Claims, 5 Drawing Figures

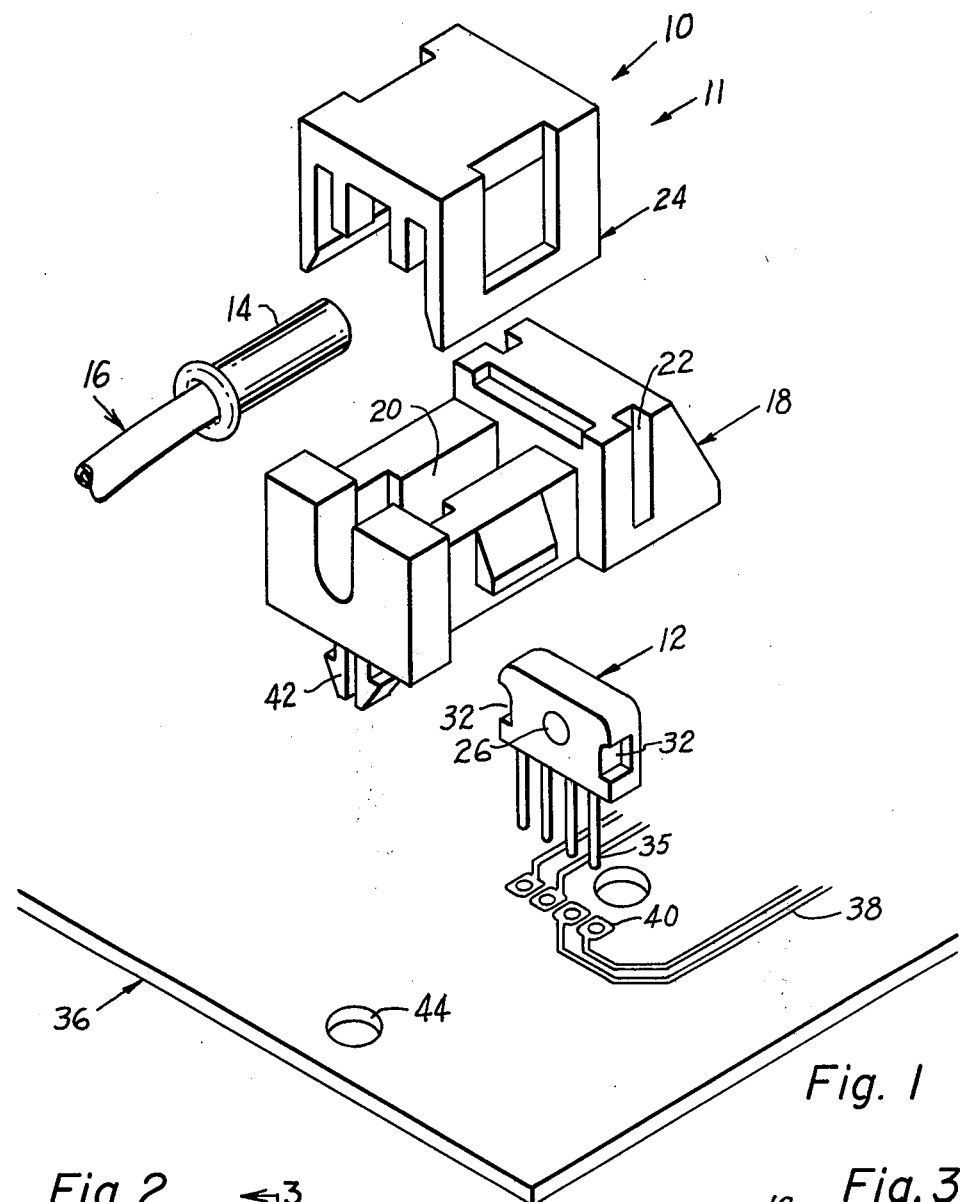
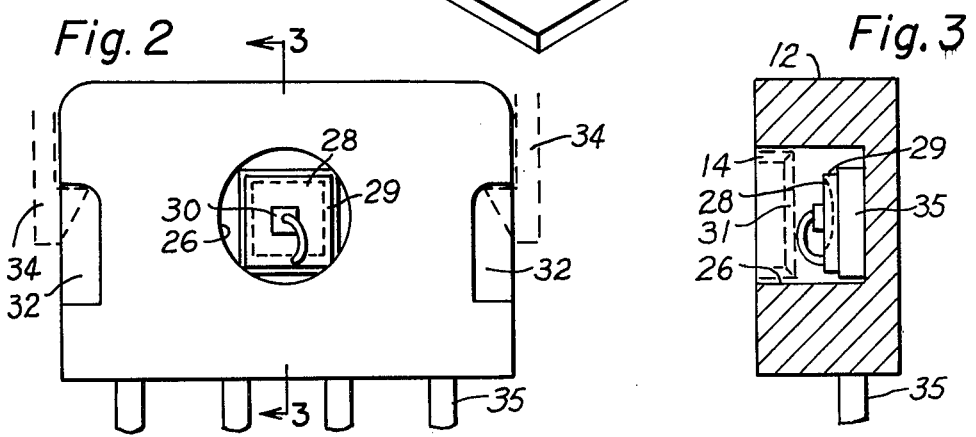

OPTICAL TRANSCEIVER

BACKGROUND OF THE INVENTION

1. Field of the Invention

The present invention relates generally to optoelectronic apparatus, and in one of its aspects to an optical transceiver.

2. Description of the Prior Art

In the past, there have existed optical transmitters and optical receivers. The usual method of handling two-way communication was to have an optics communication channel consisting of two fiber optics cables or at least two "pipes", each to be used for communicating in only one direction. Each transmitter and each receiver would have its own means for interfacing with the optics communication channel.

SUMMARY OF THE INVENTION

The present invention concerns an optical transceiver for two-way communication with an optics communication channel which can be a single optics pipe. The optical transceiver includes a light sensing device including a light sensor and a means responsive to the light sensor for transmitting electrical data. It also includes a light emitting device including a light emitter for emitting light when supplied with sufficient electric current, and means responsive to the received electrical data for supplying the light emitter with sufficient electric current. The optical transceiver further includes a means for interfacing the optical transceiver with the optics communication channel. The light sensor is positioned for receiving optical data from the optics communication channel, and the light emitter is positioned for transmitting the optical data to the optics communications channel without substantial light emission either directly or indirectly to the light sensor so that the light sensor is substantially optically isolated from the light emitter.

In an arrangement for an optics communication channel which includes an optics cable which can be a single optics pipe, the means for interfacing the optical transceiver with the optics communications channel includes a beam lead package substantially enclosing the light sensing device and the light emitting device, an eyelet adapted for affixing to one end of the optics cable, a housing which forms a channel for receivably engaging the eyelet and a slot substantially transverse to the channel receivably engaging in snap-in relationship the beam lead package, and a snap-on retainer engaging the housing for retaining the eylelet within the housing. The beam lead package forms a substantially transparent window adjacent the light sensor and the optics cable substantially aligns with the light sensor and the light emitter through the substantially transparent window when the eyelet and the beam lead package are in place in the housing so that the light sensor is positioned for receiving optical data from the optics cable and the light emitter is positioned for transmitting optical data to the optics cable. A preferred embodiment of the means for interfacing the optical transceiver with the optics communications channel includes a mirror-like surface affixed to the portion of the eyelet proximal to the light sensor and the light emitter. The mirror-like surface is so shaped that light transmitted through the optics cable and reflected off the light emitter to the mirror-like surface is substantially reflected to the light sensor.

A preferred embodiment of the means responsive to the light sensor for transmitting electrical data includes at least one bi-stable circuit responsive to the light sensor. The bi-stable circuit switches to a first state responsive to the output of the light sensor being greater than a first value and switches to a second state responsive to the output of the light sensor being less than a second value where the second value is less than the first value, thus creating a hysteresis effect so that the bi-stable circuit restores the wave form of the data. In one embodiment, the at least one bi-stable circuit is a Schmitt trigger.

A preferred embodiment of the optical transceiver also includes a mounting surface wherein the light sensor and the light emitter are mounted on the mounting surface facing substantially the same direction and the light sensor substantially encircles the light emitter. In another embodiment, the area of light sensing surface of the light sensor is substantially greater than the area of a cross-section of the light emitter taken substantially parallel to the light sensing surface, and the light emitter is mounted on the light sensor facing substantially the same direction as the light sensor. In still another embodiment, the optical transceiver further comprises a beam extending over the light sensor and spaced therefrom. The light emitter is mounted on the side of the beam facing away from the light sensor and facing substantially the same direction as the light sensor.

These and other objects, advantages and features of this invention will be apparent from the following description taken with reference to the accompanying drawings, wherein is shown the preferred embodiments of the invention.

BRIEF DESCRIPTION OF THE DRAWING

FIG. 1 is an exploded view of an optical transceiver according to the present invention;

FIG. 2 is an elevational view of a beam leaded package according to the present invention;

FIG. 3 is a sectional view of the beam leaded package taken at 3—3 of FIG. 2;

DETAILED DESCRIPTION

Figure 4:
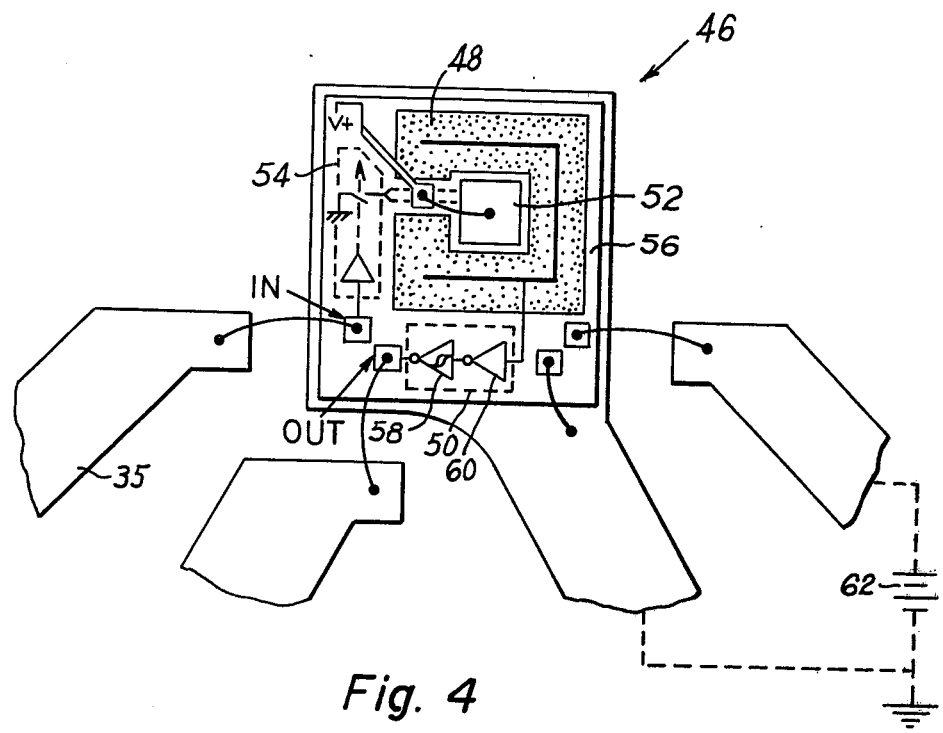
FIG. 4 is an elevational view of a preferred embodiment of a light sensing device and a light emitting device according to the present invention.

Referring now to the Figures, an optical transceiver according to the present invention is referred to generally by reference numeral 10. One embodiment of optical transceiver 10 includes a means 11 for interfacing optical transceiver 10 with an optics communication channel such as a cable 16. Means 11 includes a beam lead package 12, an eyelet 14 adapted for affixing to one end of optics cable 16, a housing 18 which forms a channel 20 for receivably engaging eyelet 14 and a slot 22 substantially transverse to channel 20 for receivably engaging in snap-in relationship beam lead package 12, and a snap-on retainer 24 for retaining eyelet 14 within housing 18. Beam lead package 12 forms a substantially transparent window 26, and when eyelet 14 is in place in channel 20 and slot 22 properly engages beam lead package 12 optics cable 16 substantially aligns with substantially transparent window 26 whereby optical data can be transmitted from beam lead package 12 through substantially transparent window 26 to optics cable 16 and can be received through substantially transparent window 26 from optics cable 16. Substantially transparent window 26 can comprise a substantially transparent pane or simply be an opening.

Optical transceiver 10 further includes a light sensing device including a light sensor 28 and a light emitting device including a light emitter 30. Light sensor 28 is diffused into substrate 29. Means 11 for interfacing optical transceiver 10 with optics cable 16 positions light sensor 28 for receiving optical data from the optics cable, and positions light emitter 30 for transmitting optical data to the optics cable without substantial light emission from the light emitter to the light sensor either directly or indirectly so that the light sensor is substantially optically isolated from the light emitter. Beam lead package 12 substantially encloses the light sensing device and the light emitting device and when means 11 for interfacing optical transceiver 10 with optics cable 16 is fully assembled, optics cable 16 substantially aligns with light sensor 28 and light emitter 30 through substantially transparent window 26.

A preferred embodiment of means 11 for interfacing optical transceiver 10 with an optics communication channel includes a mirror-like surface 31 affixed to the portion of eyelet 14 proximal to light sensor 28 and light emitter 30. Mirror-like surface 31 is so shaped that light transmitted through optics cable 16 and reflected off light emitter 30 to mirror-like surface 31 is substantially reflected to light sensor 28. Eyelet 14 is preferably constructed from a material such as brass, in which case mirror-like surface 31 can be a plating such as cadmium plating. Alternatively, eyelet 14 and mirror-like surface 31 can be of a unitary construction of a material such as beryllium copper. Mirror-like surface 31 can form a spherical, paraboloidal or ellipsoidal section or can even be just a beveled edge for some uses.

Beam lead package 12 includes notches 32, and housing 18 includes tension snaps 34 for snapping into notches 32 so that housing 18 receivably engages beam lead package 12 in snap-in relationship.

One embodiment of means 11 for interfacing optical transceiver 10 with optics cable 16 is adapted to engage a mounting board 36. Mounting board 36 includes electrical power, ground, and communication lines 38 terminating in sockets 40 for receiving beam leads 35. Housing 18 includes snap mounts 42, and mounting board 36 forms apertures 44 for receiving snap mounts 42 whereby, when means 11 is fully assembled and in place on mounting board 36, snap mounts 42 hold optical transceiver 10 snugly in place, and beam leads 35 are electrically connected to electrical lines 38.

In one embodiment, the area of light sensing surface of light sensor 28 is substantially greater than the area of a cross-section of light emitter 30 taken substantially parallel to the light sensing surface, and light emitter 30 is mounted on light sensor 28 facing substantially the same direction as light sensor 28.

Referring now to FIG. 4, an alternative embodiment of an optical transceiver according to the present invention is referred to generally by reference numeral 46. Optical transceiver 46 comprises a light sensing device including a light sensor 48 and means 50 responsive to light sensor 48 for transmitting electrical data. Optical transceiver 46 also comprises a light emitting device including light emitter 52 for emitting light when supplied with sufficient electric current and means 54 responsive to the received electrical data for supplying light emitter 52 with sufficient electric current. Optical transceiver 46 further comprises a mounting surface 56. Light sensor 48 and light emitter 52 are mounted on mounting surface 56, facing substantially the same direction and light sensor 48 substantially encircles light emitter 52 as viewed from a direction substantially perpendicular to mounting surface 56. Mounting surface 56 can be a substrate, in which case "mounted on" also includes "diffused into".

Means 50 responsive to light sensor 48 for transmitting electrical data comprises at least one bistable circuit 58 responsive to light sensor 48. Bistable circuit 58 switches to a first state responsive to the output of light sensor 48 being greater than a first value and switches to a second state responsive to the output of light sensor 48 being less than a second value, the second value being less than the first value. This introduces a certain amount of hysteresis into the response of means 50 so that the waveform is restored and less susceptible to erratic fluctuations. In one embodiment, at least one bistable circuit 58 comprises a Schmitt trigger. A preferred embodiment of means 50 responsive to the light sensor for transmitting electrical data includes an amplifier 60 for amplifying the electrical response of light sensor 48. In such an arrangement the input to at least one bistable circuit 58 is connected to the output of amplifier 60 so that at least one bistable circuit 58 is responsive to the amplified output of light sensor 48. Optical transceiver 46 is to be used in conjunction with and powered by at least one power supply 62.

Figure 5:
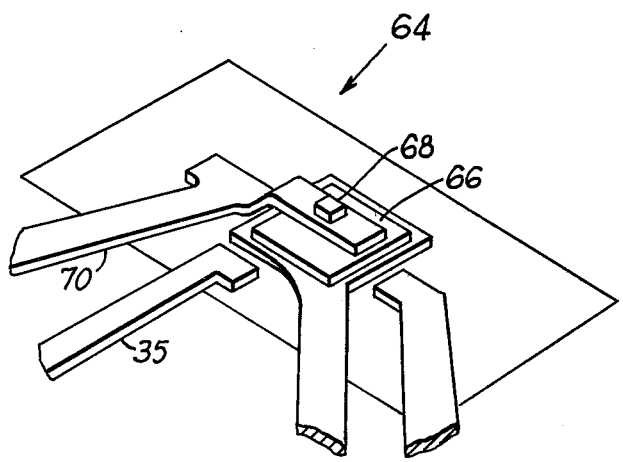
FIG. 5 is a perspective view of another embodiment of the light sensing device and the light emitting device according to the present invention.

Referring now to FIG. 5, another embodiment of the optical transceiver according to this invention is referred to generally by reference numeral 64. Optical transceiver 64 includes a light sensor 66 and a light emitter 68. Optical transceiver 64 further includes a beam 70 extending over light sensor 66 and spaced therefrom so that beam 70 is electrically isolated from light sensor 66. Light emitter 68 is mounted on the side of the beam facing away from light sensor 66, facing substantially the same direction as the light sensor.

From the foregoing it will be seen that this invention is one well adapted to attain all of the ends and objects hereinabove set forth, together with other advantages which are obvious and which are inherent to the apparatus.

It will be understood that certain features and subcombinations are of utility and may be employed without reference to other features and subcombinations. This is contemplated by and is within the scope of the claims.

As many possible embodiments may be made of the invention without parting from the scope thereof, it is to be understood that all matter herein set forth or shown in the accompanying drawings is to be interpreted as illustrative and not in a limiting sense.

The invention having been described, what is claimed is:

1. An optical transceiver to be used in conjunction with at least one power supply for receiving electrical data and transmitting optical data corresponding to the electrical data to an optics communication channel and receiving optical data from the optics communication channel and transmitting electrical data corresponding to the optical data comprising, in combination:
   (a) a light sensing device including a light sensor and means responsive to the light sensor for transmitting electrical data;

(b) a light emitting device including a light emitter for emitting light when supplied wiht sufficient electric current and means responsive to the received electrical data for supplying the light emitter with sufficient electric current; and
(c) a mounting surface, wherein said light sensor and said light emitter are mounted on said mounting surface facing substantially the same direction and said light sensor substantially encircles said light emitter as viewed from a direction substantially perpendicular to said mounting surface.

2. An optical transceiver according to claim 1 further including means for interfacing said optical transceiver with said optics communication channel wherein said light sensor is positioned for receiving optical data from the optics communication channel and the light emitter is positioned for transmitting optical data to the optics communication channel.

3. An optical transceiver according to claim 2 wherein said means for interfacing said optical transceiver with said optics communication channel comprises:
   (i) a beam lead package substantially enclosing the light sensing device and the light emitting device, wherein the beam lead package forms a substantially transparent window adjacent the light sensor and the light emitter;
   (ii) an eyelet adapted for affixing to one end of the optics communication channel;
   (iii) a housing, wherein the housing forms a channel receivably engaging the eyelet and a slot substantially transverse to the channel receivably engaging in snap-in relationship the beam lead package wherein the optics communication channel substantially aligns with the light sensor and the light emitter through the substantially transparent window; and
   (iv) a snap-on retainer engaging the housing for retaining the eyelet within the housing;
whereby the light sensor is positioned for receiving optical data from the optics communication channel and the light emitter is positioned for transmitting optical data to the optics communication channel.

4. An optical transceiver according to claim 3 wherein said means for interfacing the optical transceiver with the optics communication channel further includes a mirror-like surface affixed to the portion of the eyelet proximal to the light sensor and the light emitter wherein the mirror-like surface is so shaped that light transmitted through the optics communication channel and reflected by the light emitter to the mirror-like surface is substantially reflected to the light sensor.

5. In combination:
(a) an optical transceiver to be used in conjunction with at least one power supply for receiving electrical data and transmitting optical data corresponding to the electrical data to an optics communication channel and receiving optical data from the optics communication channel and transmitting electrical data corresponding to the optical data, comprising:
   (i) a light sensing device including a light sensor and means responsive to the light sensor for transmitting electrical data; and
   (ii) a light emitting device including a light emitter for emitting light when supplied with sufficient electric current and means responsive to the received electrical data for supplying the light emitter with sufficient electric current; wherein the light emitter is positioned for transmitting optical data without substantial light emission to the light sensor whereby the light sensor is substantially optically isolated from the light emitter; and
(b) means for interfacing said optical transceiver with an optics communication channel, comprising:
   (i) a beam lead package substantially enclosing the light sensing device and the light emitting device, wherein the beam lead package forms a substantially transparent window adjacent the light sensor and the light emitter;
   (ii) an eyelet adapted for affixing to one end of the optics communication channel;
   (iii) a housing, wherein the housing forms a channel receivably engaging the eyelet and a slot substantially transverse to the channel receivably engaging in snap-in relationship the beam lead package wherein the optics communication channel substantially aligns with the light sensor and the light emitter through the substantially transparent window; and
   (iv) a snap-on retainer engaging the housing for retaining the eyelet within the housing;
whereby the light sensor is positioned for receiving optical data from the optics communication channel and the light emitter is positioned for transmitting optical data to said optics communication channel.

6. An optical transceiver according to claim 5 wherein the means for interfacing the optical transceiver with the optics communication channel further comprises a mirror-like surface affixed to the portion of the eyelet proximal to the light sensor and the light emitter wherein the mirror-like surface is so shaped that light transmitted through the optics cable and reflected off the light emitter to the mirror-like surface is substantially reflected to the light sensor.

7. An optical transceiver according to claim 5 wherein the means responsive to the light sensor for transmitting electrical data comprises at least one bistable circuit responsive to the light sensor, the bistable circuit switching to a first state responsive to the output of the light sensor being greater than a first value and switching to a second state responsive to the output of the light sensor being less than a second value, the second value being less than the first value.

8. An optical transceiver according to claim 1 wherein the means responsive to the light sensor for transmitting electrical data comprises at least one bistable circuit responsive to the light sensor, the bistable circuit switching to a first state responsive to the output of the light sensor being greater than a first value and switching to a second state responsive to the output of the light sensor being less than a second value, the second value being less than the first value.

9. An optical transceiver to be used in conjunction with at least one power supply for receiving electrical data and transmitting optical data corresponding to the electrical data to an optics communication channel and receiving optical data from the optics communication channel and transmitting electrical data corresponding to the optical data comprising, in combination:
(a) a light sensing device including a light sensor and means responsive to the light sensor for transmitting electrical data;
(b) a light emitting device including a light emitter for emitting light when supplied with sufficient electric current and means responsive to the received electrical data for supplying the light emitter with sufficient electric current; wherein the light emitter is positioned for transmitting optical data without substantial light emission to the light sensor and wherein the area of light sensing surface of the light sensor is substantially greater than the area of a cross-section of the light emitter taken substantially parallel to the light sensing surface and the light emitter is mounted on the light sensor facing substantially the same direction as the light sensor; and (c) means for interfacing said optical transceiver with an optics cable comprising:
  (i) a beam lead package substantially enclosing the light sensing device and the light emitting device, wherein the beam lead package forms a substantially transparent window adjacent the light sensor and the light emitter;
  (ii) an eyelet adapted for affixing to one end of the optics cable;
  (iii) a housing, wherein the housing forms a channel receivably engaging the eyelet and a slot substantially transverse to the channel receivably engaging in snap-in relationship the beam lead package wherein the optics cable substantially aligns with the light sensor and the light emitter through the substantially transparent window; and
  (iv) a snap-on retainer engaging the housing for retaining the eyelet within the housing;

whereby the light sensor is positioned for receiving optical data from the optics cable and the light emitter is positioned for transmitting optical data to the optics cable.

10. An optical transceiver according to claim 9 wherein the means for interfacing the optical transceiver with the optics communication channel further comprises a mirror-like surface affixed to the portion of the eyelet proximal to the light sensor and the light emitter wherein the mirror-like surface is so shaped that light transmitted through the optics cable and reflected off the light emitter to the mirror-like surface is substantially reflected to the light sensor.

11. An optical transceiver according to claim 9 wherein the means responsive to the light sensor for transmitting electrical data comprises at least one bistable circuit responsive to the light sensor, the bistable circuit switching to a first state responsive to the output of the light sensor being greater than a first value and switching to a second state responsive to the output of the light sensor being less than a second value, the second value being less than the first value.

12. An optical transceiver to be used in conjunction with at least one power supply for receiving electrical data and transmitting optical data corresponding to the electrical data to an optics communication channel and receiving optical data from the optics communication channel and transmitting electrical data corresponding to the optical data comprising, in combination:

(a) a light sensing device including a light sensor and means responsive to the light sensor for transmitting electrical data; and (b) a light emitting device including a light emitter for emitting light when supplied with sufficient electric current and means responsive to the received electrical data for supplying the light emitter with sufficient electric current; wherein the light emitter is positioned on a beam extending over the light sensor and spaced therefrom and wherein the light emitter is mounted on the side of the beam facing away from the light sensor and facing substantially the same direction as the light sensor.

13. An optical transceiver according to claim 14 for use with an optics communication channel which comprises an optics cable, including means for interfacing the optical transceiver with said optics cable, said means for interfacing comprising:
  (i) a beam lead package substantially enclosing the light sensing device and the light emitting device wherein the beam lead package forms a substantially transparent window adjacent the light sensor and the light emitter;
  (ii) an eyelet adapted for affixing to one end of the optics cable;
  (iii) a housing, wherein the housing forms a channel receivably engaging the eyelet and a slot substantially transverse to the channel receivably engaging in snap-in relationship the beam lead package wherein the optics cable substantially aligns with the light sensor and the light emitter through the substantially transparent window; and
  (iv) a snap-on retainer engaging the housing for retaining the eyelet within the housing;

whereby the light sensor is positioned for receiving optical data from the optics cable and the light emitter is positioned for transmitting optical data to the optics cable.

14. An optical transceiver according to claim 13 wherein said means for interfacing the optical transceiver with the optics communication channel further includes a mirror-like surface affixed to the portion of the eyelet proximal to the light sensor and the light emitter wherein the mirror-like surface is so shaped that light transmitted through the optics cable and reflected by the light emitter to the mirror-like surface is substantially reflected to the light sensor.

15. An optical transceiver according to claim 12 wherein the means responsive to the light sensor for transmitting electrical data comprises at least one bistable circuit responsive to the light sensor, the bistable circuit switching to a first state responsive to the output of the light sensor being greater than a first value and switching to a second state responsive to the output of the light sensor being less than a second value, the second value being less than the first value.

* * * * *

UNITED STATES PATENT AND TRADEMARK OFFICE
CERTIFICATE OF CORRECTION

PATENT NO. : 4,268,756
DATED : May 19, 1981
INVENTOR(S) : RONALD J. CROUSE, et al.

It is certified that error appears in the above-identified patent and that said Letters Patent are hereby corrected as shown below:

In Column 5, line 2, "wiht" should read ---with---

In Column 8, line 16, "claim 14" should read ---claim 12---

Signed and Sealed this

Thirteenth Day of October 1981

[SEAL]

Attest:

GERALD J. MOSSINGHOFF

Attesting Officer — Commissioner of Patents and Trademarks